United States Patent
Endean et al.

(10) Patent No.: US 10,480,943 B2
(45) Date of Patent: Nov. 19, 2019

(54) SYSTEMS AND METHODS FOR NOISE AND DRIFT CALIBRATION USING DITHERED CALIBRATION

(71) Applicant: Honeywell International Inc., Morris Plains, NJ (US)

(72) Inventors: Daniel Endean, Plymouth, MN (US); Grant Lodden, Minnetrista, MN (US); John Reinke, Plymouth, MN (US)

(73) Assignee: Honeywell International Inc., Morris Plains, NJ (US)

( * ) Notice: Subject to any disclaimer, the term of this patent is extended or adjusted under 35 U.S.C. 154(b) by 417 days.

(21) Appl. No.: 15/366,971

(22) Filed: Dec. 1, 2016

(65) Prior Publication Data

US 2018/0094928 A1 Apr. 5, 2018

Related U.S. Application Data

(60) Provisional application No. 62/291,445, filed on Feb. 4, 2016.

(51) Int. Cl.
*G01C 19/5776* (2012.01)
*G01C 19/5691* (2012.01)
(Continued)

(52) U.S. Cl.
CPC ..... *G01C 19/5776* (2013.01); *G01C 19/5691* (2013.01); *G01C 19/5783* (2013.01);
(Continued)

(58) Field of Classification Search
CPC ............ G01C 19/5776; G01C 19/5783; G01C 25/00; G01C 25/005; G01P 3/42;
(Continued)

(56) References Cited

U.S. PATENT DOCUMENTS

| 8,726,717 B2 | 5/2014 | Supino et al. |
| 8,887,550 B2 | 11/2014 | Supino et al. |

(Continued)

FOREIGN PATENT DOCUMENTS

| CA | 2356025 | 2/2002 |
| GB | 2378765 | 2/2013 |
| GB | 2498177 | 7/2013 |

OTHER PUBLICATIONS

Bayard, "Combining Multiple Gyroscope Outputs for Increased Accuracy", Jun. 1, 2003, pp. 36-37, Publisher: NASA Tech Briefs.

*Primary Examiner* — Benjamin R Schmitt
(74) *Attorney, Agent, or Firm* — Fogg & Powers LLC (57) ABSTRACT

Systems and methods for noise and drift calibration using dithered calibration, a system comprising a processing unit; and two or more dithered calibrated sensors that provide directional measurements to the processing unit, wherein a dithered calibrated sensor in the dithered calibrated sensors has an input axis that rotates about an axis such that bias error can be removed by the processing unit; wherein the dithered calibrated sensor provides a zero-bias measurement along a first axis and a low-noise measurement along a second axis, the second axis being orthogonal to the first axis; wherein the dithered calibrated sensors are arranged such that the dithered calibrated sensor provide low-noise and zero-bias measurements along the measured axes; and wherein the processing unit executes an algorithm to combine measurements that are along the same axis to produce a measurement for each measured axis that has both low-noise and zero-bias.

20 Claims, 6 Drawing Sheets

(51) Int. Cl.
*G01C 25/00* (2006.01)
*G01C 19/5783* (2012.01)
*G01R 35/00* (2006.01)
*G01R 33/00* (2006.01)

(52) U.S. Cl.
CPC ....... *G01C 25/005* (2013.01); *G01R 33/0017* (2013.01); *G01R 35/005* (2013.01)

(58) Field of Classification Search
CPC ...... G01P 15/02; G01P 15/08; G01P 15/0802; G01P 2015/0862; G01P 21/00; G01R 35/005
USPC ........................ 73/13.7, 1.38, 514.01, 514.16
See application file for complete search history.

(56) References Cited

U.S. PATENT DOCUMENTS 9,061,891 B2    6/2015   Supino et al.
2007/0240486 A1*   10/2007   Moore ................... G01C 21/16
                                                                    73/1.37

* cited by examiner

SYSTEMS AND METHODS FOR NOISE AND DRIFT CALIBRATION USING DITHERED CALIBRATION

CROSS REFERENCE TO RELATED APPLICATIONS

This application claims the benefit of U.S. Provisional Patent Application Ser. No. 62/291,445, filed on Feb. 4, 2016, which is hereby incorporated herein by reference.

STATEMENT REGARDING FEDERALLY SPONSORED RESEARCH OR DEVELOPMENT

This invention was made with Government support under Government Contract Number FA8650-12-C-7203 awarded by the USAF. The Government has certain rights in the invention.

BACKGROUND

Certain systems use high precision sensors to provide information regarding vector quantities (such as acceleration or rotation rate). In certain types of sensors, to accurately provide measurements along a vector, a sensor desirably provides zero-output when the system is not experiencing a measureable quantity. However, certain systems may provide output signals even when an inertial sensor is not experiencing actual motion. When an output signal is produced and no measurable quantity is experienced by the sensor, the magnitude of the output signal represents a bias error. Traditionally, sensors may be factory calibrated such that when a sensor is turned on, the sensor has no bias errors. However, it is difficult to model all the possible sources of bias error during a factory calibration. For example, possible sources of bias error may include temperature variation, power cycling, long-time storage, thermal or mechanical shock, magnetic sensitivities, acceleration sensitivity, and vibration rectification. Further, the maintenance of a zero bias error is only one of several desirable quantities. It is also desirable that the sensor have a low noise output such that a navigation algorithm is able to differentiate the true signal from background noise sources.

SUMMARY

Systems and methods for noise and drift calibration using dithered calibration, a system comprising a processing unit; and two or more dithered calibrated sensors that provide directional measurements to the processing unit, wherein a dithered calibrated sensor in the two or more dithered calibrated sensors has an input axis that rotates about an axis such that bias error can be removed by the processing unit; wherein the dithered calibrated sensor provides a zero-bias measurement along a first axis and a low-noise measurement along a second axis, the second axis being orthogonal to the first axis; wherein the two or more dithered calibrated sensors are arranged with respect to each other such that the two or more dithered calibrated sensor provide low-noise and zero-bias measurements along the axes measured by the two or more dithered calibrated sensors; and wherein the processing unit executes an algorithm to combine measurements produced by the two or more dithered calibrated sensor that are along the same axis to produce a measurement for each measured axis that has both low-noise and zero-bias.

DRAWINGS

Understanding that the drawings depict only exemplary embodiments and are not therefore to be considered limiting in scope, the exemplary embodiments will be described with additional specificity and detail through the use of the accompanying drawings, in which.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

Embodiments described herein describe systems and methods for noise and drift calibration using dithered calibration. For example, systems described herein may be able to use two or more dithered calibrated sensors such that the low-noise output of a first sensor overlaps with a zero-bias output of a second sensor, where the sensors are arranged in planes that are oriented at 90 degrees to one another. For example, the a processor executing a navigation algorithm may use the low-noise output from a first sensor as an input and uses the zero-bias output, which includes measurements along the same direction as the low-noise output, to apply corrections to calculations based on the low-noise output. Thus, the different measurements may be used to perform calibration in real time such that bias errors can be corrected that change with time or other environmental inputs.

Figure 1:
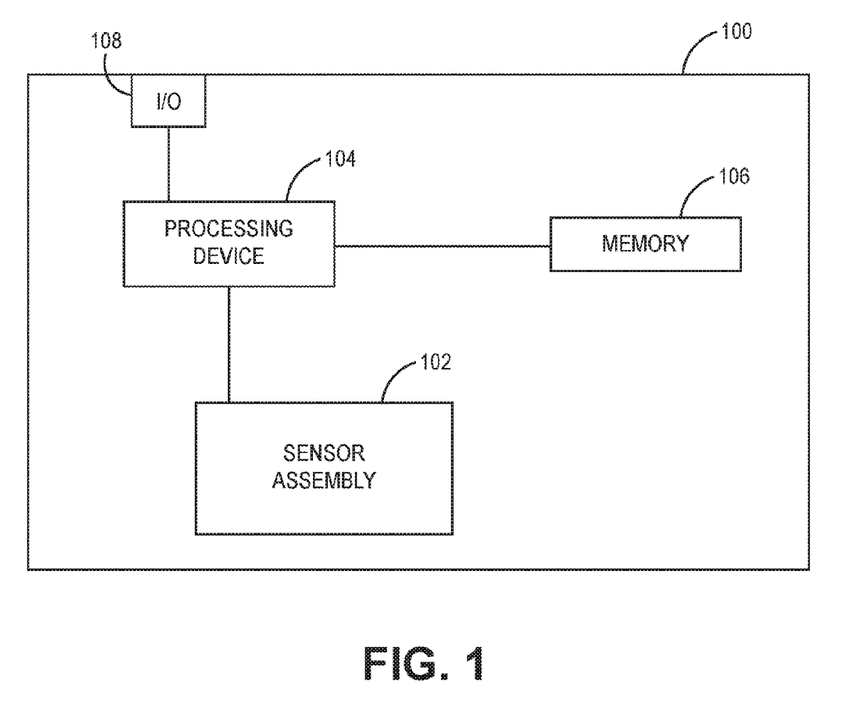
FIG. 1 is a block diagram of a system for producing inertial measurements according to embodiments described herein.

FIG. 1 is a block diagram of an example of a system 100 including a sensor assembly 102 having two or more dither calibrated sensors (DCS) that can be adjusted to reduce both bias and noise. The system 100 can include one or more processing devices 104 coupled to one or more memory devices 106 and the sensor assembly 102. The one or more memory devices can include instructions which, when executed by the one or more processing devices 104, cause the one or more processing devices 104 to perform one or more acts. In an example, the system 100 is configured as a navigation system and the instructions include instructions to perform navigation procedures including calculating a navigation solution which can be provided to other devices via an input/output port 108. For example, the one or more processing devices 104 can calculate a navigation solution based on inertial measurement data obtained by and received from the sensor assembly 102.

In an example, the one or more processing devices 104 can include a central processing unit (CPU), microcontroller, microprocessor (e.g., a digital signal processor (DSP)), field programmable gate array (FPGA), application specific integrated circuit (ASIC), or other processing device. The one or more memory devices 106 can include any appropriate processor readable medium used for storage of processor readable instructions or data structures. Suitable processor readable media can include tangible media such as magnetic or optical media. For example, tangible media such as magnetic or optical media. For example, tangible media can include a conventional hard disk, compact disk (e.g., read only or re-writable), volatile or non-volatile media such as random access memory (RAM) including, but not limited to, synchronous dynamic random access memory (SDRAM), double data rate (DDR) RAM, RAMBUS dynamic RAM (RDRAM), static RAM (SRAM), etc.), read only memory (ROM), electrically erasable programmable ROM (EE-PROM), and flash memory, etc. Suitable processor-readable media can also include transmission media such as electrical, electromagnetic, and digital signals, conveyed via a communication medium such as a network and/or a wireless link.

The sensor assembly 102 may include multiple dither calibrated sensors such that the calibrated output, for a single sensor, bias errors are reduced in comparison to a non-dithered sensor. In one exemplary embodiment of a dithered sensor, the dithered sensor may be a micro electromechanical system (MEMS) sensors that is dithered. One particular example of a dithered MEMS sensor is substantially described in U.S. Pat. No. 8,887,550, which is titled "TWO DEGREE OF FREEDOM DITHERING PLATFORM FOR MEMS SENSOR CALIBRATION" and is incorporated herein by reference.

However, the dither calibrated output of a sensor may experience increased noise. In at least one exemplary embodiment, a dithered calibrated sensor is rotated through an angle less than 90 degrees. Because the sensor is rotatably dithered through an angle less than 90 degrees, the magnitude of the output signal may be reduced in relation to any fixed noise sources such that the signals produced by a single DCS is subject to a relative increase in noise. To counter the increased noise, two outputs are monitored from a DCS. The two outputs measure vector quantities along two orthogonal axes, one vector quantity has a low noise value and the other vector quantity has a low bias error. To produce measurements having both low noise and low bias error, at least two DCSs are arranged as shown below with respect to FIGS. 4 and 5 such that a low noise measurement from a first DCS and a low bias error measurement from a second DCS are both aligned along a first axis and a low bias error measurement from the first DCS and a low noise measurement from the second DCS are both aligned along a second axis, where the first and second axes are orthogonal to one another. Accordingly, the combination of DCSs may provide measurements to the one or more processing devices 104. The one or more processing devices 104 then execute an algorithm that directs the one or more processing devices 104 to combine measurements from the different DCSs that are along the same axis. The algorithm directs the one or more processing devices 104 to combine the measurements in such that measurements having low-noise and zero-bias can be produced for the different axes measured by the DCSs. The above embodiment includes one of several possible implementations where multiple DCS may be used to generate calibrated measurements for multiple components of a vector quantity. In another embodiment, the measurement axes of the DCSs may not be aligned either due to limitations in the alignment precision or for intentional reasons (mechanical constraints on orientation within the device). In this embodiment, the final outputs computed by the one or more processing devices 104 could be computed by combining the outputs from the two or more DCSs using trigonometric combinations.

Figure 2:
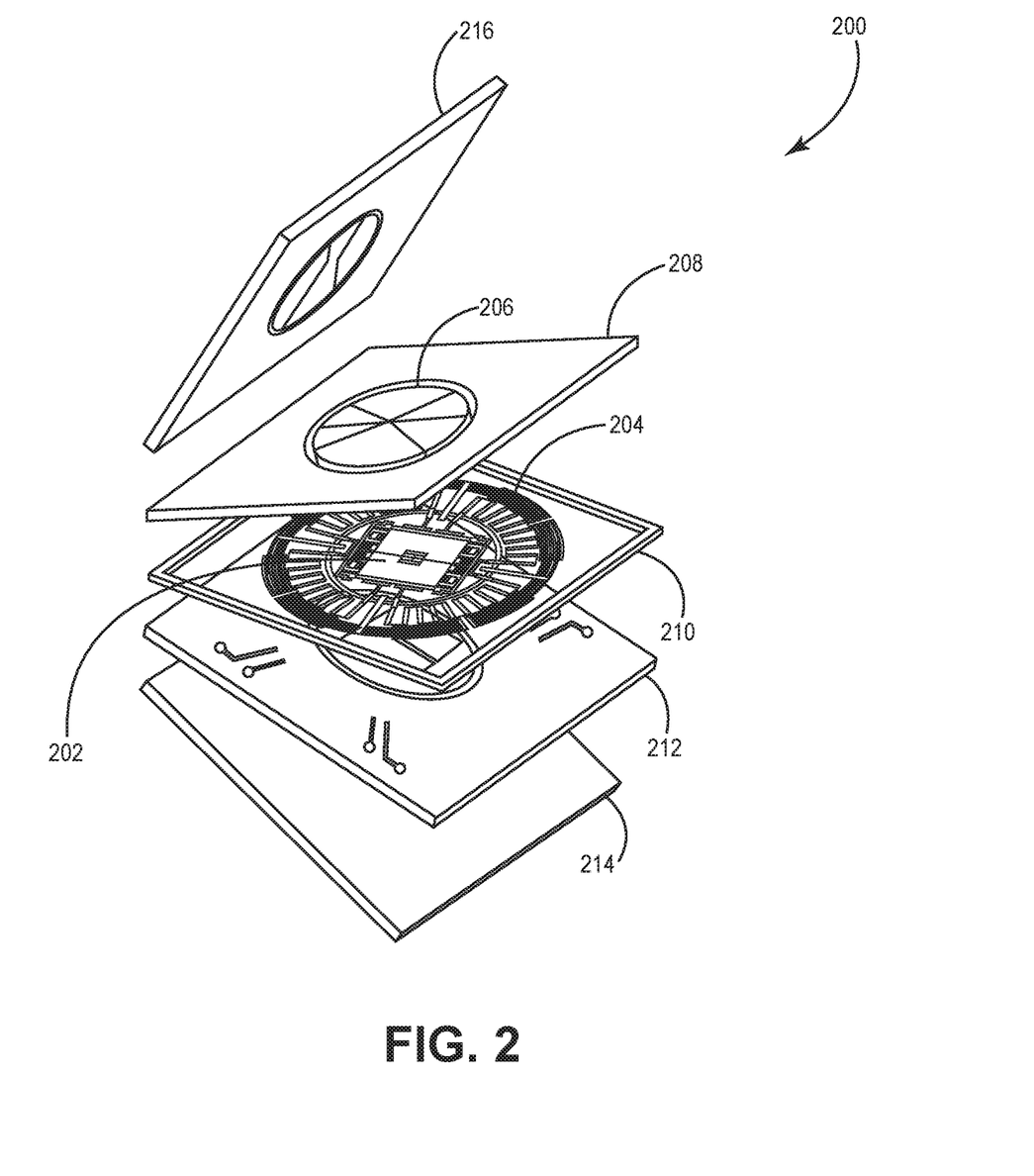
FIG. 2 is an exploded perspective view of one embodiment of a MEMS sensor in accordance with embodiments described herein.

FIG. 2 provides an example embodiment of a dithered calibrated sensor that is fabricated using MEMS technology. Sensor types other than that illustrated by FIG. 2 may also be dithered to provide similar low bias and low noise measurements. FIG. 2 is an exploded perspective view of one embodiment of a MEMS sensing device 200 having a DCS as described in the U.S. Pat. No. 8,887,550 patent and that produces signals that can be used by the one or more processing devices 104 in FIG. 1 to perform navigation procedures such as calculating a navigation solution. MEMS sensing device 200 includes a DCS 202. In certain embodiments the DCS 202 functions as a gyroscope and senses rotation about an input axis. Alternatively, the DCS 202 is an accelerometer that senses acceleration along an axis. In other implementations, the DCS 202 may be any type of sensor capable of measuring vector quantities, such as magnetometers, electric field sensors, velocity sensors, and the like. In other implementations, the DCS device may contain multiple sensors such as an accelerometer and gyroscope on the same device allowing calibrated, low-noise outputs for multiple vector quantities to be generated at the same time. Further, the DCS 202 may be part of a sensing device that includes multiple gyroscopes, accelerometers and combinations thereof. In certain embodiments, electrical and mechanical factors cause the bias and scale factor measurements produced by the DCS 202 to drift over time. To calibrate the DCS 202 and correct the bias, MEMS sensing device 200 includes an in-plane rotator 204. In-plane rotator 204 is a device that dithers the DCS 202 about an axis that runs through the DCS 202 and is perpendicular to MEMS sensor layer 210 to correct the bias drift. In certain embodiments, in-plane rotator 204 rotationally oscillates the DCS 102 in the plane of MEMS sensor layer 210. When in-plane rotator 204 oscillates the DCS 202, in-plane rotator 204 oscillates the DCS 202 up to an angular distance from a non-oscillating position. In at least one embodiment, in-plane rotator 204 is formed as part of MEMS sensor layer 210.

Figure 3:
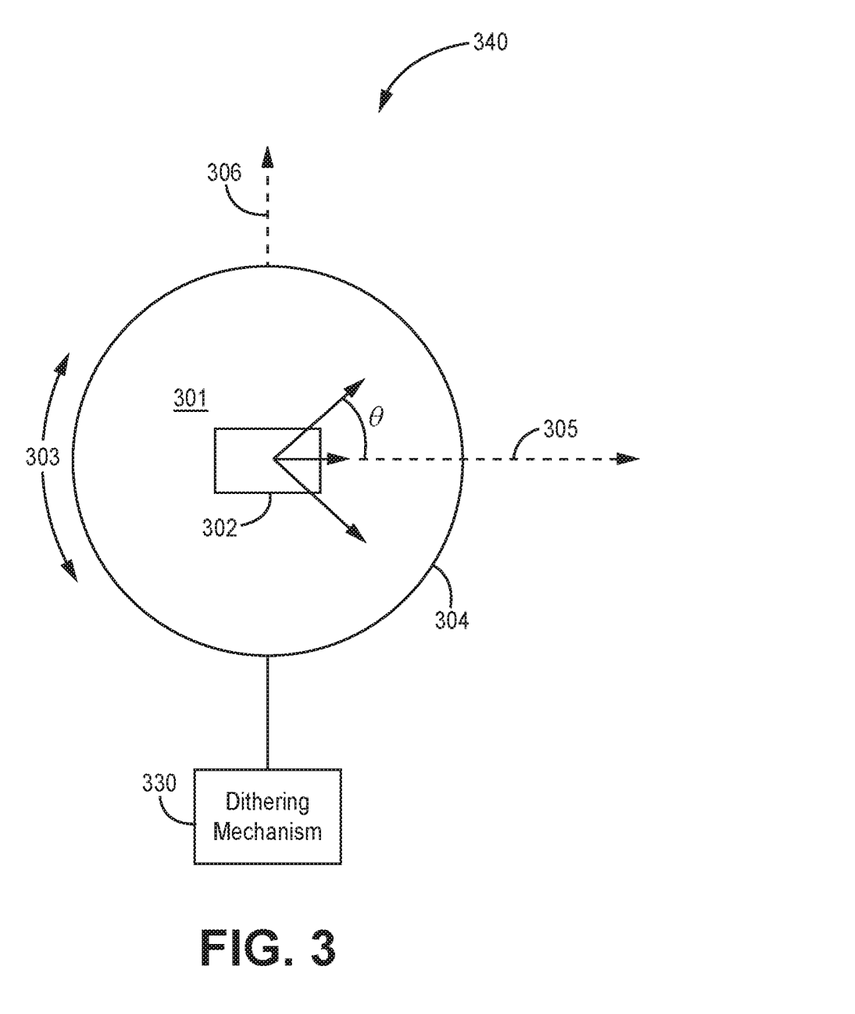
FIG. 3 is an illustration of one embodiment of a top view of a dithered calibrated sensor that is dithered in accordance with embodiments described herein.

FIG. 3 is an illustration of a top view 340 of a DCS 302 attached to a rotor 304 that is dithered through an angle θ by a dithering mechanism 330. The dithering mechanism 330 modulates the input axis of sensor 302 about an axis that is orthogonal to the input axis. The dithering mechanism 330 may control the modulation using mechanical motion using devices such as springs, motors, or electrodes controlled through electromagnetic fields. Alternatively, the dithering mechanism 330 may also control the dithering through devices that modulate the input axis of sensor 302 without mechanically moving the sensor 302.

In exemplary embodiments described herein, the input axis of sensor 302 is rotated through an angle of 2θ. When sensor 302 is dithered at frequency ω, the input signal sensed by sensor 302 at time t can be approximated to second order in angle as:

$$\Omega_{in} = \Omega_x\left[1 - \frac{1}{2}\cos(\theta)\sin^2(\omega t)\right] + \Omega_y\sin(\theta)\sin(\omega t)$$

where $\Omega_x$ is the signal to be sensed along direction 305, $\Omega_y$ is the signal to be sensed along direction 306. The approximation made in the above equation is valid for θ<10 degrees. In other embodiments, the approximation may be made more accurate by including higher order terms in the calculation. The output of sensor 302 can then be written as:

$$V_{out} = SF\left(\Omega_x\left[1 - \frac{1}{2}\cos(\theta)\sin^2(\omega t)\right] + \Omega_y\sin(\theta)\sin(\omega t)\right) + B(t)$$

where SF is the proportionality constant relating the output signal of sensor 302 to the input signal magnitude, and B(t) is a time varying bias of sensor 302.

The input signals, $\Omega_x$ and $\Omega_y$, can be obtained by analyzing the output signal $V_{out}$ in two ways. Applying a low-pass filter to $V_{out}$, such as a simple moving average produces an output signal:

$$V_x = SF \times \Omega_x\left[1 - \frac{1}{2}\cos(\theta)\right] + LPF[B(t)]$$

where LPF is a low pass filter having a cut-off frequency less than ω. At the same time, if the output signal is multiplied by a reference sine wave and then a low-pass filter is applied, the result yields $$V_y = SF \times \Omega_y \frac{1}{2}\sin(\theta)$$

In comparing the above two results, it is apparent that the processed signal $V_x$ contains information about the input signal in direction 305 and the bias B(t) while $V_y$ contains only information about the input signal in direction 306. However, the magnitude of the output signal for a given input signal is smaller by a factor of sin(θ) in the $V_y$ output when compared to $V_x$. Therefore the signal to noise ratio of the $V_y$ signal will be lower for a fixed noise level than the $V_x$ signal but $V_y$ will contain zero bias.

Figure 4:
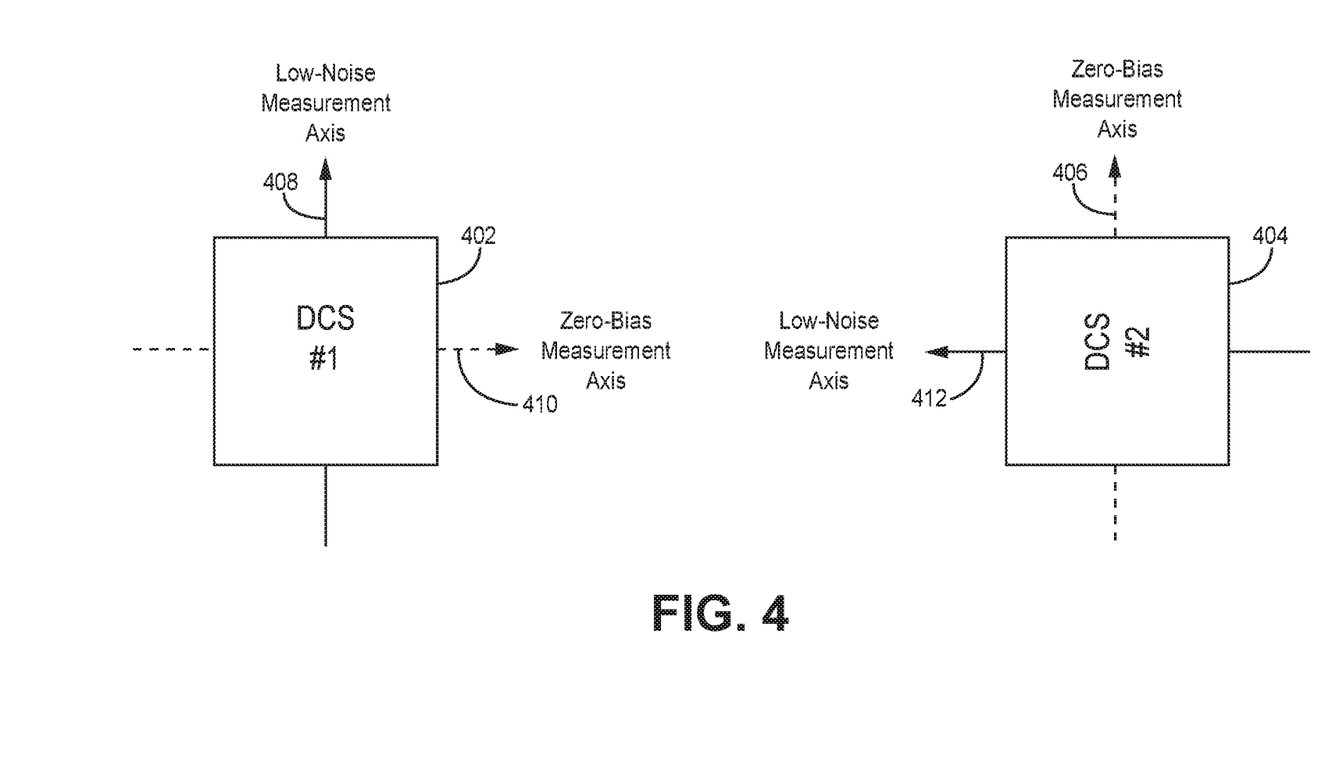
FIG. 4 is a block diagram illustrating arrangements of two dithered calibrated sensors in accordance with embodiments described herein.

FIG. 4 illustrates a first DCS 400 and a second DCS 402, substantially described above, that can be used together to provide both low noise and zero-bias measurements. As discussed above with respect to FIG. 3, dithering allows for the correction of bias errors in the measurements provided by the first DCS 402 and the second DCS 404, as each of the first DCS 402 and the second DCS 404 provides measurements along a respective zero-bias measurement axes 410 and 406. Also, the dithering also decreases the magnitude of the output of the first DCS 402 and the second DCS 404 along the respective zero-bias measurement axes 410 and 406, thus decreasing the signal to noise ratio along the zero-bias measurement axes 410 and 406. However, a DCS as described above also provides low noise measurements along an axis that is orthogonal to the zero-bias measurement axis produced by the respective sensor, represented herein as the low-noise measurement axis. Accordingly, each of the first DCS 402 and the second DCS 404 also provides measurements along respective low-noise measurement axes 408 and 412. As each of the first DCS 402 and the second DCS 404 provides measurements along orthogonal low noise measurement axes 408 and 412 and zero-bias measurement axes 410 and 406, multiple DCSs may be combined in such a way that both low noise measurements and zero-bias measurements can be acquired along each of the axes.

In certain embodiments, as the system of FIG. 4 may include a first DCS 402 and a second DCS 404, the first DCS 402 and the second DCS 404 may be mounted within a package such that the low-noise measurement axis 408 of the first DCS 402 is aligned with zero-bias measurement axis 406 of the second DCS 404. Also, the zero-bias measurement axis 410 of the first DCS 402 may be aligned with the low-noise measurement axis 412 of the second DCS 404. As described above, the measurements from the first DCS 402 and the second DCS 404 may be combined to provide measurements that have both zero-bias and low noise.

Figure 5:
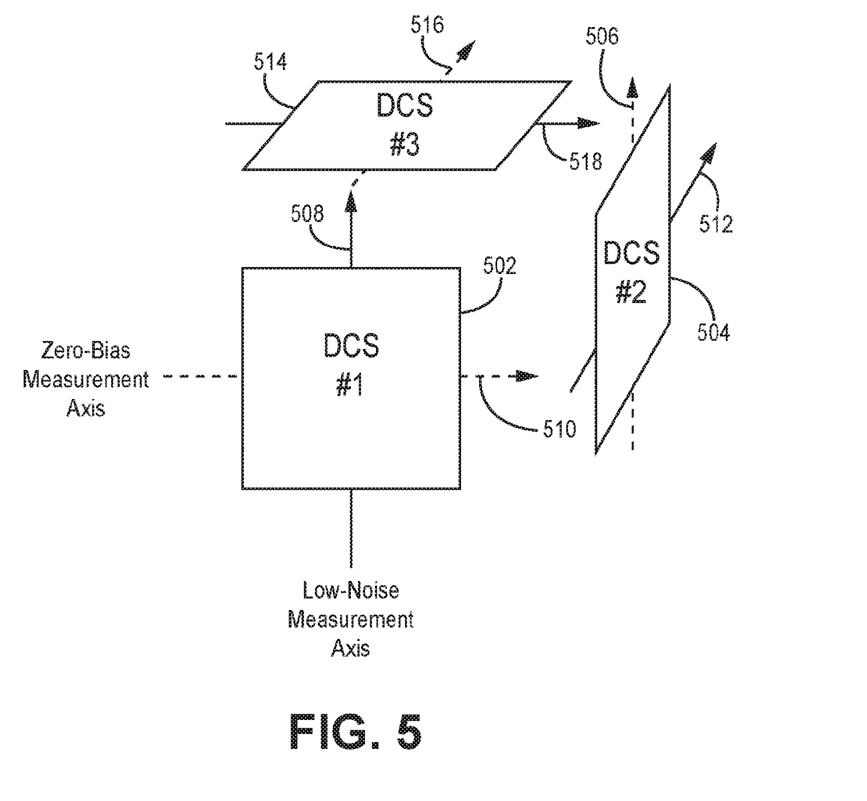
FIG. 5 is a block diagram illustrating arrangements of three dithered calibrated sensors in accordance with embodiments described herein.

In a further implementation, as illustrated in FIG. 5, a system may include at least three different DCSs that are arranged to provide low-noise and zero bias measurements in three dimensions. For example, the system may include a first DCS 502, a second DCS 504, and a third DCS 514. The first DCS 502 provides measurements along both a zero-bias measurement axis 510 and a low-noise measurement axis 508, where the low-noise measurement axis 508 is orthogonal to the zero-bias measurement axis 510. Similarly, the second DCS 504 provides measurements along both a zero-bias measurement axis 506 and a low-noise measurement axis 512, where the low-noise measurement axis 512 is orthogonal to the zero-bias measurement axis 506. Further, the third DCS 514 provides measurements along both a zero-bias measurement axis 516 and a low-noise measurement axis 518, where the low noise measurement axis 518 is orthogonal to the zero-bias measurement axis 516. The first DCS 502, the second DCS 504, and the third DCS 514 may be mounted within a package such that the different measurement axes overlap to provide low-noise and zero-bias measurements along three different axes. For example, the low-noise measurement axis 508 measured by the first DCS 502 and the zero-bias measurement axis 506 measured by the second DCS 504 may be aligned with one another. Further, the zero-bias measurement axis 510 measured by the first DCS 502 and the low-noise measurement axis 518 measured by the third DCS 514 may be aligned with one another. Also, the low-noise measurement axis 512 measured by the second DCS 504 and the zero-bias measurement axis 516 measured by the third DCS 514 may be aligned with one another. Accordingly, the arrangement of three DCSs may provide low-noise, zero-bias measurements along three orthogonal axes.

In certain implementations, the three DCSs may be used in an inertial measurement unit to provide inertial data in three dimensions. In a further embodiment, the inertial measurement unit may include two sets of three DCSs, where the first set is used to measure rotation and the second set is used to measure acceleration. Alternatively, the combinations of DCSs may also be used to provide measurements of magnetic fields, electric fields, velocity, and other directional measurements.

Figure 6:
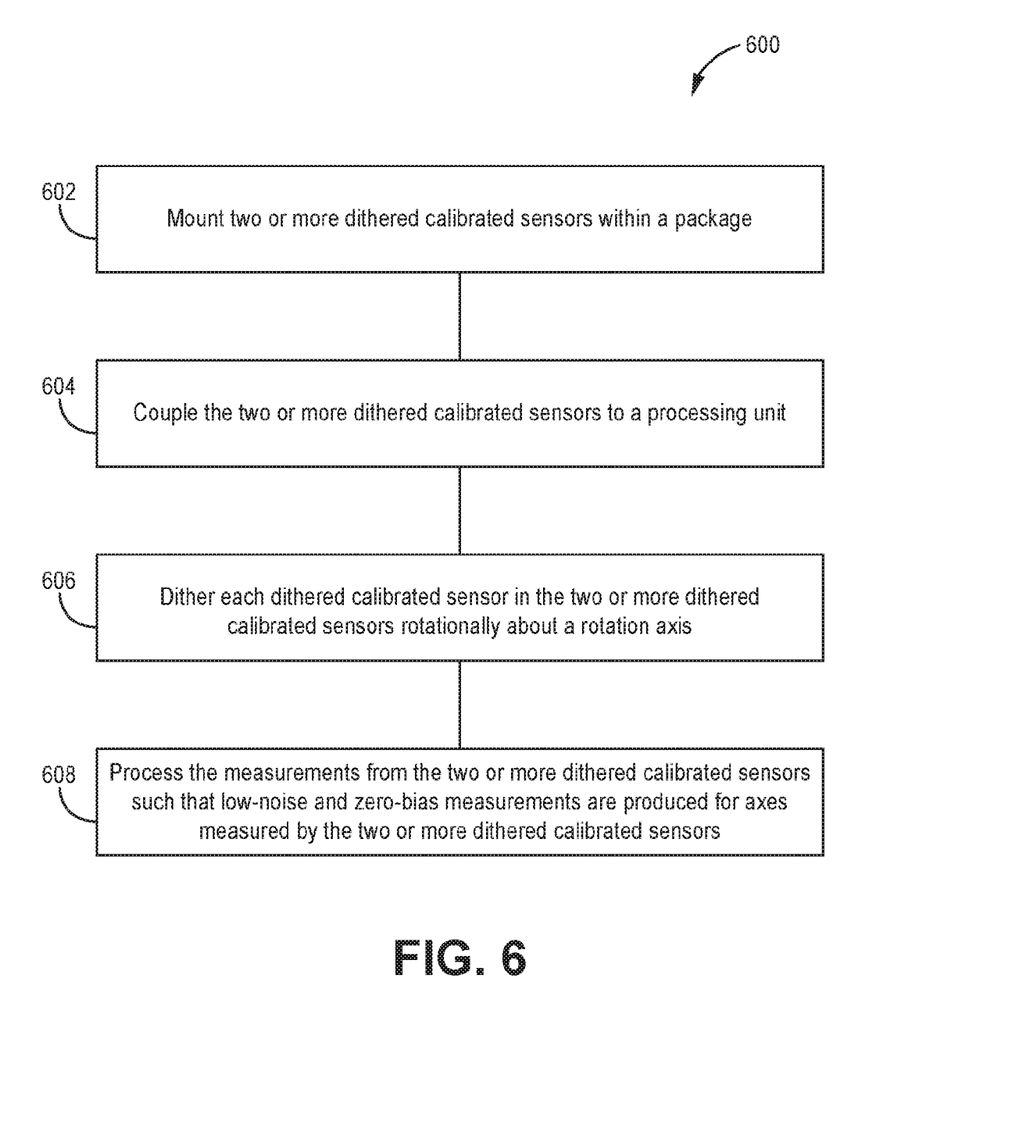
FIG. 6 is a flow diagram illustrating a method for producing low-noise and zero-bias measurements in accordance with embodiments described herein.

FIG. 6 is a flow diagram illustrating a method 600 for providing low-noise and low-bias measurements. Method 600 proceeds at 602, where two or more dithered calibrated sensors are mounted within a package. For example, the two or more dithered calibrated sensors may be inertial sensors or other sensor capable of providing a vector measurement. In certain implementations, method 600 proceeds at 604, where the two or more dithered calibrated sensors are coupled to a processing unit. Further, method 600 proceeds at 606, where each dithered calibrated sensor in the two or more dithered calibrated sensors is dithered rotationally about a rotation axis. Also, method 600 proceeds at 608, where the measurements from the two or more dithered calibrated sensors are processed such that low-noise and zero-bias measurements are produced for axes measured by the two or more dithered calibrated sensors. For example, each sensor may dithered such that the sensors provide a low-noise measurement along a first axis and a zero-bias measurement along a second axis, where the second axis is orthogonal to the first axis. A processing device may use the measurements from the different sensors to produce low-noise and zero-bias measurements for the different axes measured by the two or more dithered calibrated sensors.

EXAMPLE EMBODIMENTS

Example 1 includes a system for providing low-noise and low-bias measurements, the system comprising: a processing unit; and two or more dithered calibrated sensors that provide directional measurements to the processing unit, wherein a dithered calibrated sensor in the two or more dithered calibrated sensors has an input axis that rotates about an axis such that bias error can be removed by the processing unit; wherein the dithered calibrated sensor provides a zero-bias measurement along a first axis and a low-noise measurement along a second axis, the second axis being orthogonal to the first axis; and wherein the two or more dithered calibrated sensors are arranged with respect to each other such that the two or more dithered calibrated sensor provide low-noise and zero-bias measurements along the axes measured by the two or more dithered calibrated sensors; wherein the processing unit executes an algorithm to combine measurements produced by the two or more dithered calibrated sensor that are along the same axis to produce a measurement for each measured axis that has both low-noise and zero-bias.

Example 2 includes the system of Example 1, wherein the two or more dithered calibrated sensors are at least one of: inertial sensors; magnetometers; electric field sensors; and velocity sensors.

Example 3 includes the system of any of Examples 1-2, wherein the low-noise and zero-bias measurements are passed through a low pass filter to produce a simple moving average for the low-noise and zero-bias measurements.

Example 4 includes the system of any of Examples 1-3, further comprising an in-plane rotator configured to dither the two or more dithered calibrated sensors about a respective axis.

Example 5 includes the system of any of Examples 1-4, wherein the two or more dithered calibrated sensors comprise at least one set of three sensors that are arranged to provide the low-noise measurements and the zero-bias measurements in three directions/measurement axes.

Example 6 includes the system of any of Examples 1-5, wherein a dithered calibrated sensor in the two or more dithered calibrated sensors measures two different quantities simultaneously.

Example 7 includes the system of Example 7, wherein the two different quantities include acceleration and rotation.

Example 8 includes a method for providing low-noise and low-bias measurements, the method comprising: mounting two or more dithered calibrated sensors within a package; coupling the two or more dithered calibrated sensors to a processing unit, wherein the dithered calibrated sensors provide directional measurements to the processing unit; dithering each dithered calibrated sensors in the two or more dithered calibrated sensors rotationally about a rotation axis such that each dithered calibrated sensor provides a low-noise measurement along a first axis and a zero-bias measurement along a second axis, wherein the second axis is orthogonal to the first axis; and processing the measurements from the two or more dithered calibrated sensors such that low-noise and zero-bias measurements are produced for the axes measured by the two or more dithered calibrated sensors.

Example 9 includes the method of Example 8, wherein the two or more dithered calibrated sensors are at least one of: inertial sensors; magnetometers; electric field sensors; and velocity sensors.

Example 10 includes the method of any of Examples 8-9, further comprising passing the low-noise and zero-bias measurements through a low pass filter to produce a simple moving average for the low-noise and zero-bias measurements.

Example 11 includes the method of any of Examples 8-10, wherein the two or more dithered calibrated sensors comprise at least one set of three sensors that are arranged to provide the low-noise measurements and the zero-bias measurements in three dimensions.

Example 12 includes the method of any of Examples 8-11, wherein a dithered calibrated sensor in the two or more dithered calibrated sensors measures two different quantities simultaneously.

Example 13 includes the method of Example 13, wherein the two different quantities include acceleration and rotation.

Example 14 includes a sensor assembly, the sensor assembly comprising: two or more dithered calibrated sensors that provide directional measurements to a processing unit, wherein a dithered calibrated sensor in the two or more dithered calibrated sensors has an input axis that rotates about an axis such that bias error can be removed by the processing unit; wherein the two or more dithered calibrated sensors are arranged with respect to each other such that the two or more dithered calibrated sensor provide both low-noise and zero-bias measurements along the axes measured by the two or more dithered calibrated sensors; and wherein the processing unit executes an algorithm to combine measurements produced by the two or more dithered calibrated sensor that are along the same axis to produce a measurement for each measured axis that has both low-noise and zero-bias.

Example 15 includes the sensor assembly of Example 14, wherein the low-noise and zero-bias measurements are passed through a low pass filter to produce a simple moving average for the low-noise and zero-bias measurements.

Example 16 includes the sensor assembly of any of Examples 14-15, further comprising an in-plane rotator configured to dither the two or more dithered calibrated sensors about a respective axis.

Example 17 includes the sensor assembly of any of Examples 14-16, wherein the two or more dithered calibrated sensors comprise at least one set of three sensors that are arranged to provide the low-noise measurements and the zero-bias measurements in three dimensions.

Example 18 includes the sensor assembly of any of Examples 14-17, wherein a dithered calibrated sensor in the two or more dithered calibrated sensors measures two different quantities simultaneously.

Example 19 includes the sensor assembly of Example 18, wherein the two different quantities include acceleration and rotation.

Example 20 includes the sensor assembly of any of Examples 14-19, wherein the two or more dithered calibrated sensors are at least one of: inertial sensors; magnetometers; electric field sensors; and velocity sensors.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

The invention claimed is:

1. A system for providing low-noise and low-bias measurements, the system comprising:
   a processing unit; and
   two or more dithered calibrated sensors that provide directional measurements to the processing unit, wherein a dithered calibrated sensor in the two or more dithered calibrated sensors has an input axis that rotates about an axis such that bias error can be removed by the processing unit;
   wherein the dithered calibrated sensor provides a zero bias measurement along a first axis and a low noise measurement along a second axis, the second axis being orthogonal to the first axis;
   wherein the two or more dithered calibrated sensors are arranged with respect to each other such that the first axis of a first dithered calibrated sensor in the two or more dithered calibrated sensors is aligned with the zero-bias measurement of a second dithered calibrated sensor in the two or more dithered calibrated sensors; and
   wherein the processing unit executes an algorithm to combine measurements produced by the two or more dithered calibrated sensors that are along the same axis to produce a measurement for each measured axis that has both low-noise and zero-bias, wherein the measurement is produced by combining the low-noise measurement from the first dithered calibrated sensor with the zero-bias measurement from the second dithered calibrated sensor.

2. The system of claim 1, wherein the two or more dithered calibrated sensors are at least one of:
   inertial sensors;
   magnetometers;
   electric field sensors; and
   velocity sensors.

3. The system of claim 1, wherein the low-noise and zero-bias measurements are passed through a low pass filter to produce a simple moving average for the low-noise and zero-bias measurements.

4. The system of claim 1, further comprising an in-plane rotator configured to dither the two or more dithered calibrated sensors about a respective axis.

5. The system of claim 1, wherein the two or more dithered calibrated sensors comprise at least one set of three sensors that are arranged to provide the low-noise measurements and the zero-bias measurements in three directions/measurement axes.

6. The system of claim 1, wherein a dithered calibrated sensor in the two or more dithered calibrated sensors measures two different quantities simultaneously.

7. The method of claim 6, wherein the two different quantities include acceleration and rotation.

8. A method for providing low-noise and low-bias measurements, the method comprising:
   mounting two or more dithered calibrated sensors within a package;
   coupling the two or more dithered calibrated sensors to a processing unit, wherein the dithered calibrated sensors provide directional measurements to the processing unit;
   dithering each dithered calibrated sensors in the two or more dithered calibrated sensors rotationally about a rotation axis such that each dithered calibrated sensor provides a low-noise measurement along a first axis and a zero-bias measurement along a second axis, wherein the second axis is orthogonal to the first axis, wherein the first axis of a first dithered calibrated sensor in the two or more dithered calibrated sensors is aligned with the second axis of a second dithered calibrated sensor in the two or more dithered calibrated sensors; and
   processing the measurements from the two or more dithered calibrated sensors such that low-noise and zero-bias measurements are produced for the axes measured by the two or more dithered calibrated sensors, wherein a low-noise and zero-bias measurement is produced by combining the low-noise measurement from the first dithered calibrated sensor with the zero-bias measurement from the second dithered calibrated sensor.

9. The method of claim 8, wherein the two or more dithered calibrated sensors are at least one of:
   inertial sensors;
   magnetometers;
   electric field sensors; and
   velocity sensors.

10. The method of claim 8, further comprising passing the low-noise and zero-bias measurements through a low pass filter to produce a simple moving average for the low-noise and zero-bias measurements.

11. The method of claim 8, wherein the two or more dithered calibrated sensors comprise at least one set of three sensors that are arranged to provide the low-noise measurements and the zero-bias measurements in three dimensions.

12. The method of claim 8, wherein a dithered calibrated sensor in the two or more dithered calibrated sensors measures two different quantities simultaneously.

13. The method of claim 12, wherein the two different quantities include acceleration and rotation.

14. A sensor assembly, the sensor assembly comprising:
   two or more dithered calibrated sensors that provide directional measurements to a processing unit, wherein a dithered calibrated sensor in the two or more dithered calibrated sensors has an input axis that rotates about an axis such that bias error can be removed by the processing unit;
   wherein the two or more dithered calibrated sensors are arranged with respect to each other such that a low-noise measurement axis of a first dithered calibrated sensor in the two or more dithered calibrated sensors is aligned with a zero-bias measurement axis of a second dithered calibrated sensor in the two or more dithered calibrated sensors; and
   wherein the processing unit executes an algorithm to combine measurements produced by the two or more dithered calibrated sensors that are along the same axis to produce a measurement for each measured axis that has both low-noise and zero-bias, wherein the measurement is produced by combining a low-noise measurement by the first dithered calibrated sensor along the low-noise measurement axis and the zero-bias measurement by the second dithered calibrated sensor along the zero-bias measurement axis.

15. The sensor assembly of claim 14, wherein the low-noise and zero-bias measurements are passed through a low pass filter to produce a simple moving average for the low-noise and zero-bias measurements.

16. The sensor assembly of claim 14, further comprising an in-plane rotator configured to dither the two or more dithered calibrated sensors about a respective axis.

17. The sensor assembly of claim 14, wherein the two or more dithered calibrated sensors comprise at least one set of three sensors that are arranged to provide the low-noise measurements and the zero-bias measurements in three dimensions.

18. The sensor assembly of claim 14, wherein a dithered calibrated sensor in the two or more dithered calibrated sensors measures two different quantities simultaneously.

19. The sensor assembly of claim 18, wherein the two different quantities include acceleration and rotation.

20. The sensor assembly of claim 14, wherein the two or more dithered calibrated sensors are at least one of:
 inertial sensors;
 magnetometers;
 electric field sensors; and
 velocity sensors.

\* \* \* \* \*

UNITED STATES PATENT AND TRADEMARK OFFICE
CERTIFICATE OF CORRECTION

PATENT NO. : 10,480,943 B2
APPLICATION NO. : 15/366971
DATED : November 19, 2019
INVENTOR(S) : Daniel Endean, Grant Hamilton Lodden and John Reinke It is certified that error appears in the above-identified patent and that said Letters Patent is hereby corrected as shown below:

Under Column 9, Claim 1, Line 25, 26 and 27, please replace "dithered calibrated sensor provides a zero bias measurement along a first axis and a low noise measurement along a second axis" with --dithered calibrated sensor provides a low-noise measurement along a first axis and a zero-bias measurement along a second axis--

Signed and Sealed this
Sixth Day of October, 2020

Andrei Iancu
*Director of the United States Patent and Trademark Office*